US006252283B1

(12) United States Patent
Gardner et al.

(10) Patent No.: US 6,252,283 B1
(45) Date of Patent: Jun. 26, 2001

(54) CMOS TRANSISTOR DESIGN FOR SHARED N+/P+ ELECTRODE WITH ENHANCED DEVICE PERFORMANCE

(75) Inventors: Mark I. Gardner, Cedar Creek; Dim-Lee Kwong; Frederick N. Hause, both of Austin, all of TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/234,855

(22) Filed: Jan. 22, 1999

(51) Int. Cl.$^7$ ............................ H01L 27/01; H01L 29/76; H01L 29/94; H01L 31/113; H01L 27/12
(52) U.S. Cl. ..................... 257/407; 257/385; 257/371; 257/351
(58) Field of Search ........................... 257/250–251, 257/382–385, 410–412, 405–407, 368–371; 438/300–305, 290–231

(56) References Cited

U.S. PATENT DOCUMENTS

| 5,668,024 | * | 9/1997 | Tsai et al. | 438/199 |
| 5,707,896 | * | 1/1998 | Chiang et al. | 438/231 |
| 6,013,577 | * | 1/2000 | Kimizuka | 438/659 |

OTHER PUBLICATIONS

Apt Poly–Si Gate With Nitrogen–Doped Poly–Si Layer For Deep Submicron Prospects. Kanagawa Inspec PN B9308–2570F–004, May 1991.*
Stanley Wolf and Richard N. Tauber; *Silicon Processing for the VLSI Era, vol. 1—Process Technology*; p. 1; 1986.
Stanley Wolf and Richard N. Tauber; *Silicon Processing for the VLSI Era, vol. 2—Process Integration*; pp. 508–510, 1990.

* cited by examiner

*Primary Examiner*—Tom Thomas
*Assistant Examiner*—Cuong Q Nguyen
(74) *Attorney, Agent, or Firm*—Timothy M. Honeycutt

(57) ABSTRACT

An integrated circuit and a method of making a transistor thereof are provided. In one aspect, the method includes the steps of forming a gate dielectric layer on the substrate and forming a gate electrode on the gate dielectric layer with a lower surface, a midpoint, and a quantity of p-type impurity. A quantity of nitrogen is introduced into the gate electrode whereby the quantity nitrogen has a peak concentration proximate the lower surface. A quantity of germanium is introduced into the gate electrode and first and second source/drain regions are formed in the substrate. The method enables simultaneous formation of n-channel and p-channel gate electrodes with work functions tailored for both types of devices.

10 Claims, 4 Drawing Sheets

CMOS TRANSISTOR DESIGN FOR SHARED N+/P+ ELECTRODE WITH ENHANCED DEVICE PERFORMANCE

BACKGROUND OF THE INVENTION

1. Field of the Invention

This invention relates generally to semiconductor processing, and more particularly, to an integrated circuit with transistors, and to a method of making the same incorporating a shared doping scheme for transistors of different conductivity types.

2. Description of the Related Art

A typical field effect transistor implemented in silicon consists of a source and a drain formed in a silicon substrate, and separated laterally to define a channel region in the substrate. A gate electrode composed of a conducting material, such as aluminum or polysilicon, is disposed over the channel region and designed to emit an electric field into the channel region. Changes in the electric field emitted by the gate electrode enable, or alternatively, disable the flow of current between the source and the drain.

In a conventional process flow for forming a typical field effect transistor, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The gate electrode acts as a hard mask against the implant so that the source and drain are formed in the substrate self-aligned to the gate electrode. Many conventional semiconductor fabrication processes employ a double implant process to form the source and drain. The first implant is performed self-aligned to the gate electrode to establish lightly doped drain ("LDD") structures. After the LDD implant, dielectric sidewall spacers are formed adjacent to the gate electrode by depositing and anisotropically etching a dielectric material, such as silicon dioxide. The second of the two source/drain implants is then performed self-aligned to the sidewall spacers. The substrate is annealed to activate the dopant in the source and the drain. Salicidation steps frequently follow the formation of the source and drain.

Early MOS integrated circuits were implemented as p-channel enhancement mode devices using aluminum as the gate electrode material. Aluminum had the advantages of relatively low resistivity and material cost. Furthermore, there was already a large body of manufacturing experience with aluminum in the chip industry developed from bipolar integrated circuit processing.

A later process innovation that is still widely used today, involves the use of heavily doped polysilicon as a gate electrode material in place of aluminum. The switch to polysilicon as a gate electrode material was the result of certain disadvantages associated with aluminum in early fabrication technologies. In conventional semiconductor fabrication processing, aluminum must be deposited following completion of all high temperature process steps (including drive-in of the source and drain regions). As a result, an aluminum gate electrode must ordinarily be separately aligned to the source and drain. This alignment procedure can adversely affect both packing density and parasitic overlap capacitances between the gate and source/drain regions. In contrast, polysilicon with its much higher melting point, can be deposited prior to source and drain formation and therefore provide for self-aligned gate processing. Furthermore, the high temperature capability of polysilicon is routinely exploited to enable interlevel dielectric layers to be applied to provide multiple metallization layers with improved planarity.

Despite the several advantages of polysilicon over aluminum as a gate electrode material, polysilicon has the disadvantage of polysilicon depletion effects. In p-channel transistors, the source and drain are commonly formed in the substrate by implanting a p-type dopant, such as boron. The implant also deposits boron into the polysilicon of the gate electrode. Subsequent thermal processing steps to fabricate a conventional p-channel field effect transistor frequently cause boron to diffuse from the gate electrode through the gate oxide layer and into the channel region. If the amount of boron diffused is sufficiently high, the electrical performance of the field effect transistor may be severely degraded due to polysilicon depletion.

Another potential shortcoming of conventional gate electrode formation, particularly in CMOS circuits, is asymmetrical threshold voltages for n-channel and p-channel devices. For optimal logic gate performance, the threshold voltages of n-channel and p-channel devices in a CMOS circuit should have comparable magnitudes. In addition, it is desirable to keep threshold voltages for both types of devices as small as possible in order to minimize subthreshold currents and needless power consumption. Conventional process flows have incorporated various combinations of $n^+$ or $p^+$ polysilicon gate electrodes for n-channel and p-channel devices. For n-channel devices incorporating $n^+$ polysilicon gate electrodes, the work function of $n^+$ polysilicon is ideal, and will yield threshold voltages of less than about 0.7 volts for common values of channel doping and oxide thicknesses. However, where $n^+$ polysilicon is used as the gate electrode for a p-channel device, proper control of threshold voltage is more difficult since the threshold voltage of the p-channel device is already more negative than −0.7 volts, particularly in the doping range of $10^{15}$ to $10^{17}$ $cm^{-3}$.

A boron implant is commonly used to adjust the threshold voltage of p-channel as well as n-channel devices in CMOS circuits with $n^+$ polysilicon gates. This approach has been widely used in semiconductor processing but requires careful tailoring of the background dopings of the substrate and the well in view of the parameters for the threshold voltage control implant. The requisite tying of these various parameters represents processing complexity and a limitation on the flexibility of a given process flow.

Another approach in CMOS processing has involved a dual-doped polysilicon process in which $n^+$ polysilicon is used as the gate electrode material for n-channel devices and $p^+$ polysilicon is used as a gate electrode material for p-channel devices. Such a dual doped approach can lead to difficulties when interconnection is made between the $n^+$ and $p^+$ polysilicon gate electrodes, such as when the two transistors are used to construct an inverter. The interconnect between the $n^+$ and $p^+$ polysilicon gates is frequently made via a silicide local interconnect strap that provides a diffusion pathway for the p and n-type dopants of the two gates. During subsequent high temperature steps the migrating p and n-type dopants may counterdope the respective gate electrodes and significantly degrade the performance of the transistors.

The present invention is directed to overcoming or reducing the effects of one or more of the foregoing disadvantages.

SUMMARY OF THE INVENTION

In accordance with one aspect of the present invention, an integrated circuit is provided that includes a substrate and a plurality of transistors positioned thereon. Each of the plurality of transistors has a gate dielectric layer positioned on the substrate, a first source/drain region and a second source/drain region, and a gate electrode positioned on the gate dielectric layer. The gate electrode has a lower surface, a midpoint, a quantity of p-type impurity, a quantity of nitrogen having a peak concentration proximate the lower surface, and a quantity of germanium.

In accordance with another aspect of the present invention, an integrated circuit transistor on a substrate is provided that includes a gate dielectric layer positioned on the substrate, a first source/drain region and a second source/drain region. A gate electrode is positioned on the gate dielectric layer. The gate electrode has a lower surface, a midpoint, a quantity of p-type impurity, a quantity of nitrogen having a peak concentration proximate the lower surface, and a quantity of germanium.

In accordance with another aspect of the present invention, a method of fabricating an integrated circuit transistor on a substrate is provided. The method includes the steps of forming a gate dielectric layer on the substrate and forming a gate electrode on the gate dielectric layer with a lower surface, a midpoint, and a quantity of p-type impurity. A quantity of nitrogen is introduced into the gate electrode whereby the quantity nitrogen has a peak concentration proximate the lower surface. A quantity of germanium is introduced into the gate electrode and first and second source/drain regions are formed in the substrate.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
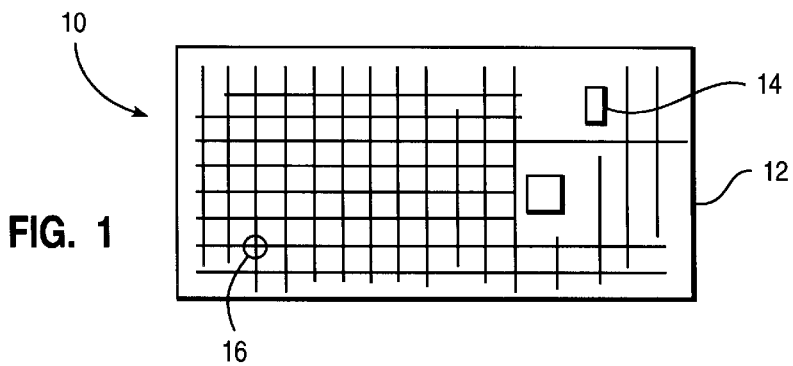
FIG. 1 is a plan view of an exemplary embodiment of an integrated circuit in accordance with the present invention.

In the drawings described below, reference numerals are generally repeated where identical elements appear in more than one figure. Turning now to the drawings, and in particular to FIG. 1, there is shown a plan view of an exemplary embodiment of an integrated circuit 10 implemented on a semiconductor substrate 12. The integrated circuit 10 includes a plurality of circuit elements depicted schematically and designated 14. The circuit elements 14 include transistors, capacitors, resistors and the like. The substrate 12 may be composed of n-doped silicon, p-doped silicon, silicon-on-insulator, or the like.

Figure 2:
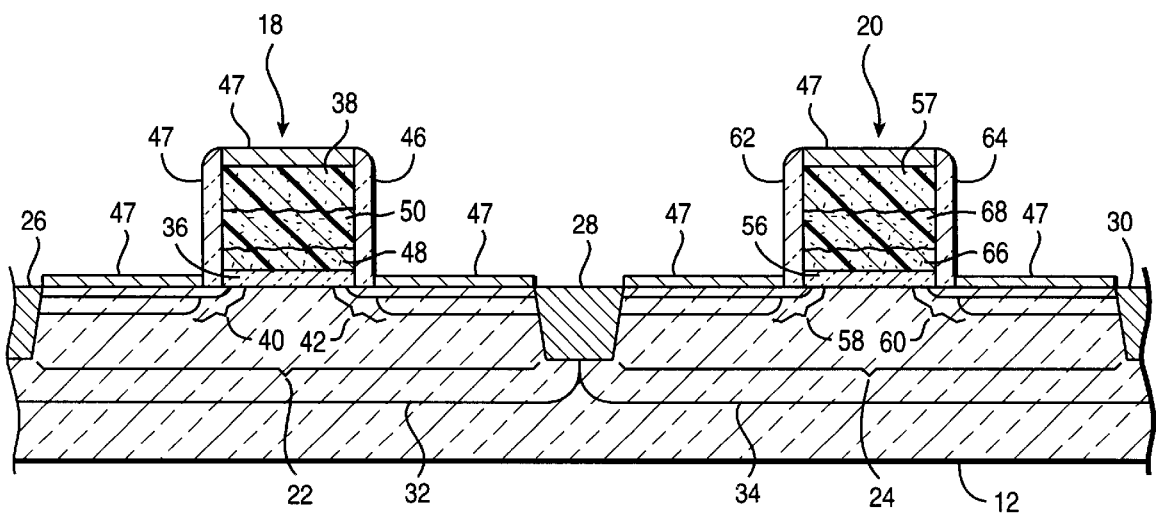
FIG. 2 is a highly magnified cross-sectional view of a portion of the integrated circuit depicted in FIG. 1 in accordance with the present invention.

The detailed structure of two exemplary transistors of the integrated circuit 10 may be understood by referring now also to FIG. 2, which is a highly magnified cross-sectional view of the portion of the integrated circuit 10 circumscribed by the circle 16 on FIG. 1. The transistors, designated 18 and 20, are implemented on active areas 22 and 24 of the substrate that are circumscribed and generally defined by isolation structures 26, 28 and 30. The isolation structures 26, 28 and 30 appear in FIG. 2 as individual structural elements, however, the structures 26, 28 and 30 are generally part of an integrally formed moat-like structure surrounding all of the active areas of the substrate 12. The transistors 18 and 20 are formed over respective wells 32 and 34 in the substrate 12. The wells 32 and 34 may be n-wells, p-wells or other type of well structure. The transistors 18 and 20 may similarly be n-channel devices, p-channel devices or other types of transistors. In an exemplary embodiment, and for the purpose of illustration, the transistor 18 is an n-channel field effect transistor and the transistor 20 is a p-channel field effect transistor. Accordingly, the well 32 is a swell and the well 34 is a n-well.

The transistor 18 includes a gate dielectric layer 36 positioned on the substrate 12, a gate electrode 38 positioned on the gate dielectric layer and source/drain regions 40 and 42 positioned in the substrate 12. As used herein, the terms "formed on", "disposed on" or "positioned on" should be construed to include the possibility that a given layer or structure may be formed on another given layer or structure with a third or other intervening layers or structures disposed between the two. The phrase "source/drain region(s)" is used herein to describe a region that may serve as either a source or a drain. The skilled artisan will appreciate that a source/drain region may function as a source or a drain depending upon how it is interconnected with subsequent metallization. The gate electrode 38 and the gate dielectric layer 36 are bracketed by a pair of dielectric sidewall spacers 44 and 46. Enhanced ohmic contact between subsequent metallization (not shown) and the gate 38 and the source/drain regions 40 and 42 is provided by a silicide layer 47 composed of cobalt silicide, titanium silicide or the like. As used herein, the phrase "composed of" is not intended to exclude the incorporation of other constituents in a given layer.

The gate electrode 38 may be composed of polysilicon, amorphous silicon or the like. In an exemplary embodiment the gate electrode 38 is composed of polysilicon. The polysilicon gate electrode 38 is rendered conductive by a dispersed quantity of p-type impurity introduced by implantation or diffusion as described below. The gate electrode 38 is also provided with a quantity of nitrogen doping represented schematically by the region designated 48, and a quantity of germanium doping represented schematically by the region designated 50.

Figure 3:
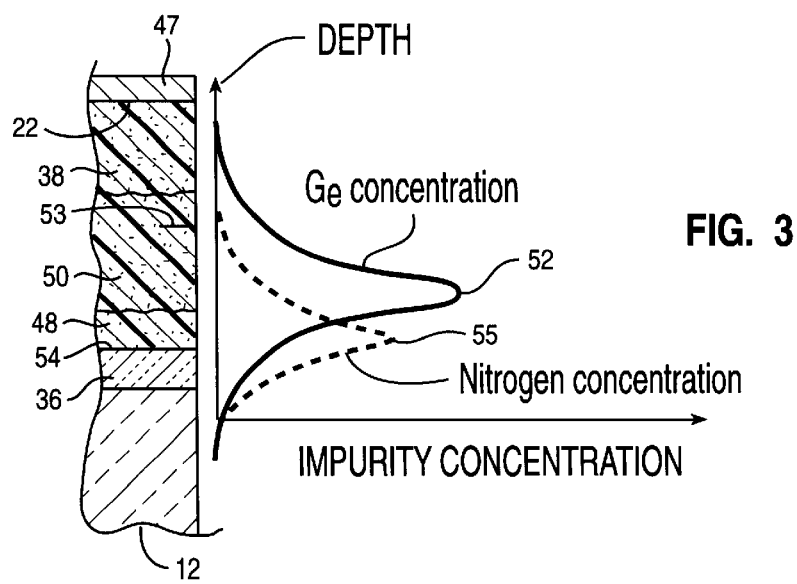
FIG. 3 is a plot of impurity concentration vs. depth for an exemplary transistor of the integrated circuit depicted in FIG. 1 in accordance with the present invention.

The more detailed character of the doping of the gate electrode 38 may be understood by referring now also to FIG. 3, which is a plot of impurity concentration versus depth in the gate electrode 38. A portion of the gate electrode 38 and surrounding structures are superimposed next to the plot. The solid curve depicts the germanium concentration profile. Note that the concentration of germanium near the upper surface 51 of the gate electrode 38 is relatively low. This ensures that germanium atoms will not interfere with the metal-silicon reaction necessary to establish the silicide layer 47. The position of the peak 52 of the germanium concentration curve is a function of a number of variables, such as implant energy, thickness and composition of the gate electrode, implant angle, and post-implant heating cycles, among others. In the illustrated embodiment, the germanium is implanted and annealed so that the peak concentration 52 falls approximately between the midpoint 53 of the gate electrode 38 and the lower surface 54 thereof. However, the goal of achieving low germanium concentration with minimal silicide reaction disruption may be attained with various concentration profiles.

The dashed curve depicts the nitrogen concentration profile. Note that the peak 55 of the nitrogen concentration curve is positioned proximate the lower surface 54 of the gate electrode 38. This profile provides a high nitrogen concentration at the interface between the gate electrode 38 and the gate dielectric layer 36 for enhanced resistance to gate-to-substrate dopant migration and dielectric breakdown due to tunneling or other effects. As with the depiction of the germanium concentration, the nitrogen concentration curve is intended to be illustrative, as the actual profile will be a function of a number of parameters.

The transistor 20 similarly consists of a gate dielectric layer 56 positioned on the substrate 12, a gate electrode 57 positioned on the gate dielectric layer 56 and source/drain regions 58 and 60 positioned in the substrate 12. The gate electrode 57 and the gate dielectric layer 56 are similarly bracketed by a pair of dielectric sidewall spacers 62 and 64. Like the gate electrode 38 of the transistor 18, the gate electrode 57 of the transistor 20 is provided with a quantity of conductivity rendering p-type impurity, and quantities of nitrogen doping 66 and germanium doping 68. Enhanced ohmic contact is provided by the silicide layer 47.

The nitrogen doped regions 48 and 70 in the gate electrodes 38 and 57 enhance the dielectric character of the gate dielectric layers 36 and 56 and act as diffusion barriers against the migration of impurities from the gate electrodes 38 and 57 into the substrate 12. The germanium doping regions 50 and 68 tailor the work functions of the gate electrodes 38 and 57 so that the gate electrodes 38 and 57 both function in a surface state control mode despite being devices of opposite conductivity type. The germanium doping provides this modification of the work functions of the gates 38 and 57 without acting as the conductivity rendering dopant.

Figure 4:
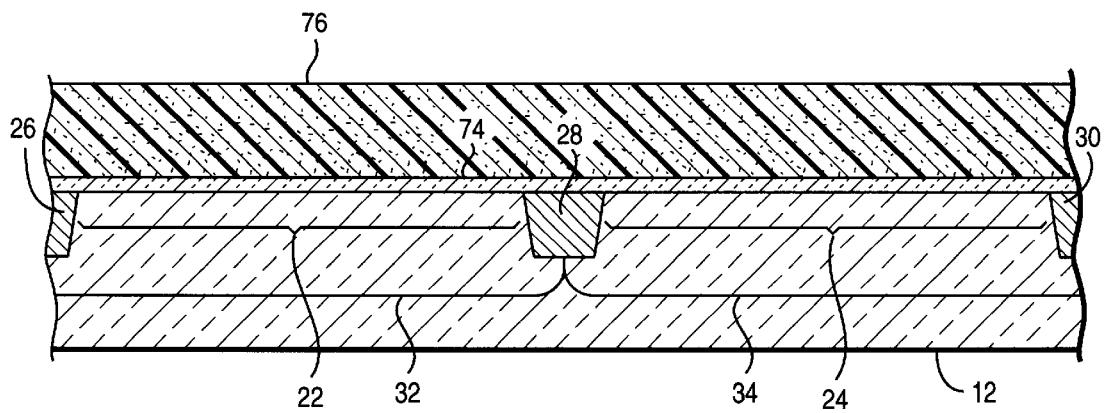
FIG. 4 is a cross-sectional view of a semiconductor substrate depicting the initial formation of insulating and conductor layers thereon in accordance with the present invention.

An exemplary process flow for fabricating the transistors 18 and 20 depicted in FIG. 2 in accordance with the present invention may be understood by referring now to FIGS. 4–10, and initially to FIG. 4. The process flow will be described in the context of CMOS device processing. However, the skilled artisan will appreciate that the transistors 18 and 20 may be implemented as n-channel, p-channel or other types of devices. Initially, the wells 32 and 34 are established in the substrate 12 by ion implantation or diffusion as desired. The wells 32 and 34 may be twin, twin retrograde, or similar suitable wells, and are formed in the substrate 12 by using well known techniques involving the alternative masking and ion implantation of the active areas 22 and 24 using dopants of opposite conductivity type for each well. Following the implants, the substrate 12 is annealed to drive the wells 32 and 34 to the desired depth. The skilled artisan will appreciate that the parameters for the well implants and the anneal process will depend on the initial doping level of the substrate, and the design rules for the fabrication process used.

The isolation structures 26, 28 and 30 may be shallow trench isolation, field oxide, or other isolation structures. In an exemplary embodiment, the structures 26, 28 and 30 are shallow trench isolation structures and may be composed of silicon dioxide, tetra-ethyl-ortho-silicate ("TEOS") or other suitable isolation materials, and may be formed using well known damascene etching and fill techniques.

An insulating layer 74 is formed on the substrate 12 by oxidation, blanket CVD or the like. Through subsequent patterning, the layer 74 will be subdivided into the gate dielectric layers 36 and 56 shown in FIG. 2. Accordingly, the layer 74 is advantageously composed of suitable gate dielectric materials, such as, for example, silicon dioxide, silicon nitride, $Ta_2O_5$, or the like. In an exemplary embodiment, the layer 74 is composed of silicon dioxide formed by thermal oxidation to a thickness of about 12 to 25 Å. A rapid thermal anneal ("RTA") with an oxygen containing ambient at about 800 to 1050° C. for about 10 to 30 seconds may be used. Optionally, a furnace process may be used for about 10 to 30 minutes. The layer 74 may be bolstered against gate-to-channel dopant migration and dielectric breakdown by introducing a nitrogen bearing species, such as $N_2$, NO, $N_2O$ or the like into the ambient. For example, the ambient may contain about 10% $N_2$ by volume.

A conductor layer 76 is deposited on the insulating layer 74. Through subsequent patterning, the conductor layer 76 will be segregated into the respective gate electrodes 38 and 57 shown in FIG. 2. The conductor layer 76 may be composed of polysilicon, amorphous silicon or the like. In an exemplary embodiment, polysilicon is deposited by CVD to a thickness of about 1000 to 2000 Å.

The polysilicon layer 76 is next subjected to three implants to establish a conductivity rendering level of p-type impurity, and quantities of nitrogen and germanium that will consist of the regions 48, 50, 66 and 68 shown in FIG. 2 when the conductor layer 76 is subsequently patterned to establish the gate electrodes 38 and 57. Initially, an implant of nitrogen is performed to establish a quantity of nitrogen doping represented schematically by the region 78. As described more fully below, the region 78 will be subsequently subdivided into the nitrogen doped regions 48 and 66 shown in FIG. 2. The goal of the nitrogen implant is to establish a concentration profile of nitrogen of the type depicted in FIG. 3 following an anneal to be described below. Atomic or molecular nitrogen may be implanted as desired. In an exemplary embodiment, atomic nitrogen is implanted at an energy of about 30 to 100 keV and a dosage of about 5E14 to 5E15 $cm^{-2}$. The implant angle may be about 0°.

Figure 5:
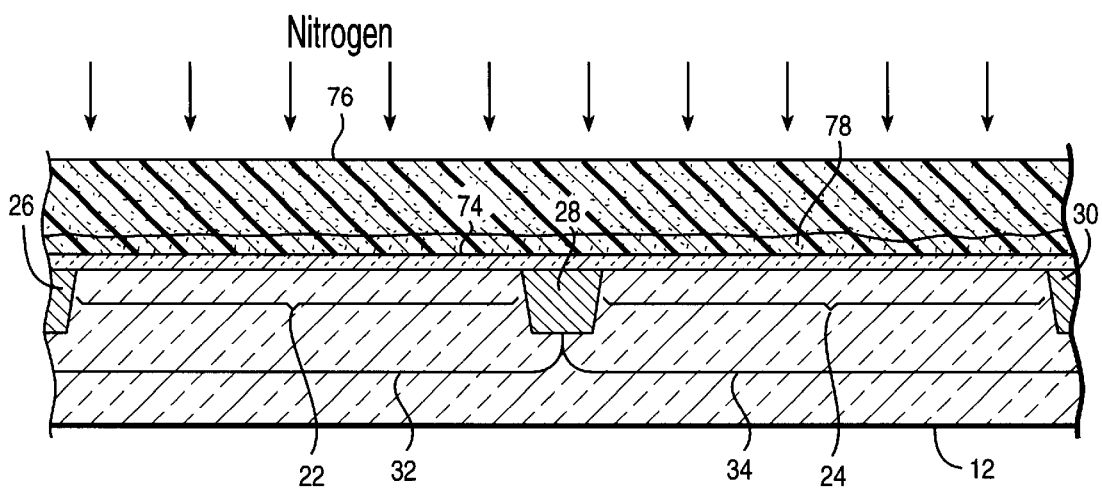
FIG. 5 is a cross-sectional view like FIG. 4 depicting implantation of nitrogen into the conductor layer in accordance with the present invention.
Figure 6:
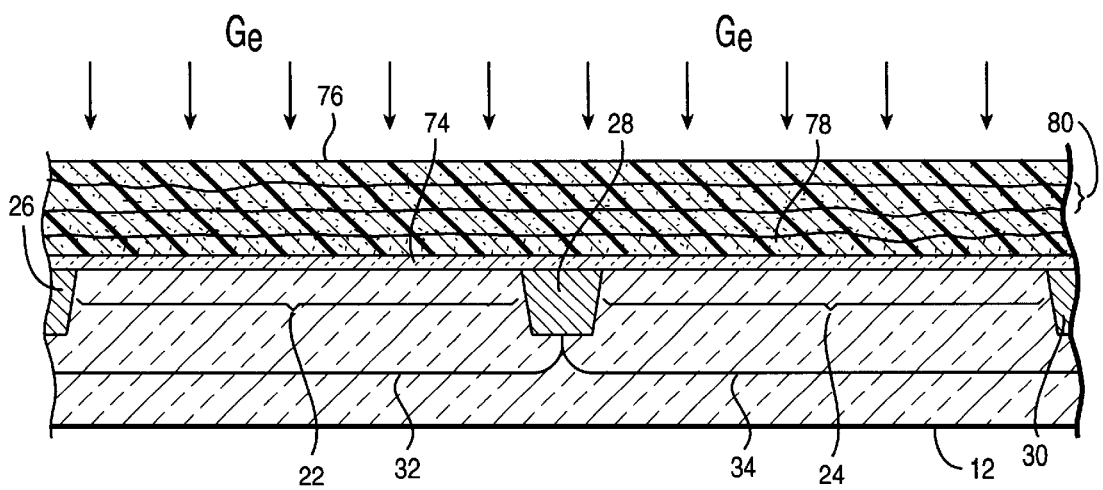
FIG. 6 is a cross-sectional view like FIG. 5 depicting implantation of germanium into the conductor layer in accordance with the present invention.

Referring now to FIG. 5, an implant of germanium is performed as indicated by the arrows to establish a quantity of germanium doping represented schematically by the region 80. As with the nitrogen doping region 78, the region 80 will be subsequently subdivided into the germanium doped regions 50 and 68 shown in FIG. 2. The energy and dosage of the implant are tailored to establish a concentration profile of germanium of the type depicted in FIG. 3 following an anneal to be described below. In an exemplary embodiment, germanium may be implanted at an energy of about 15 to 60 keV with a dosage of about 1E15 to 8E16 $cm^{-2}$. The implant angle may be about 0°.

Figure 7:
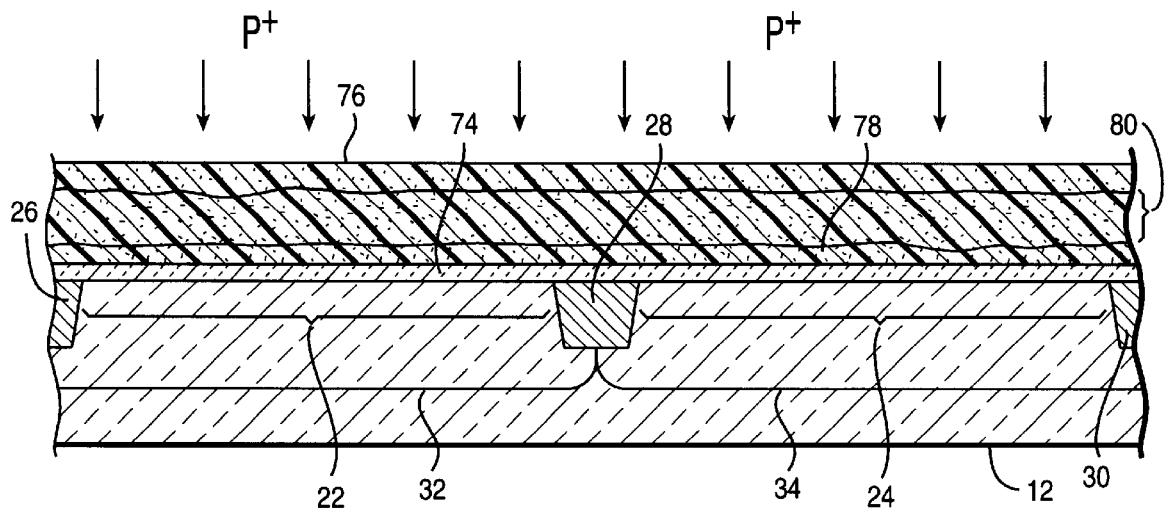
FIG. 7 is a cross-sectional view like FIG. 6 depicting implantation of a p-type impurity into the conductor layer in accordance with the present invention.

Referring now to FIG. 7, an implant of p-type impurity is performed to establish a conductivity Tendering level of p-type doping concentration in the polysilicon layer 76. The impurity species may be $BF_2$, boron or the like. A low mobility impurity species, such as $BF_2$, is desirable. In an exemplary embodiment, $BF_2$ may be implanted at an energy of about 10 to 50 keV and a dosage of about 1E15 to 5E15 $cm^{-2}$. The implant angle may be 0°.

The conductor layer 76 is subsequently annealed at about 700 to 900° C. for about 30 to 120 seconds in an RTA process or for about 5 to 15 minutes in a furnace process. The anneal distributes germanium in the lower portions of the layer 76, leaving the upper portion thereof relatively free of germanium. P-type impurity atoms will be distributed throughout the polysilicon layer 76. As noted above, the absence of germanium in the upper portion of the layer 76 facilitates the subsequent formation of the silicide layer 47 depicted in FIG. 2.

Figure 8:
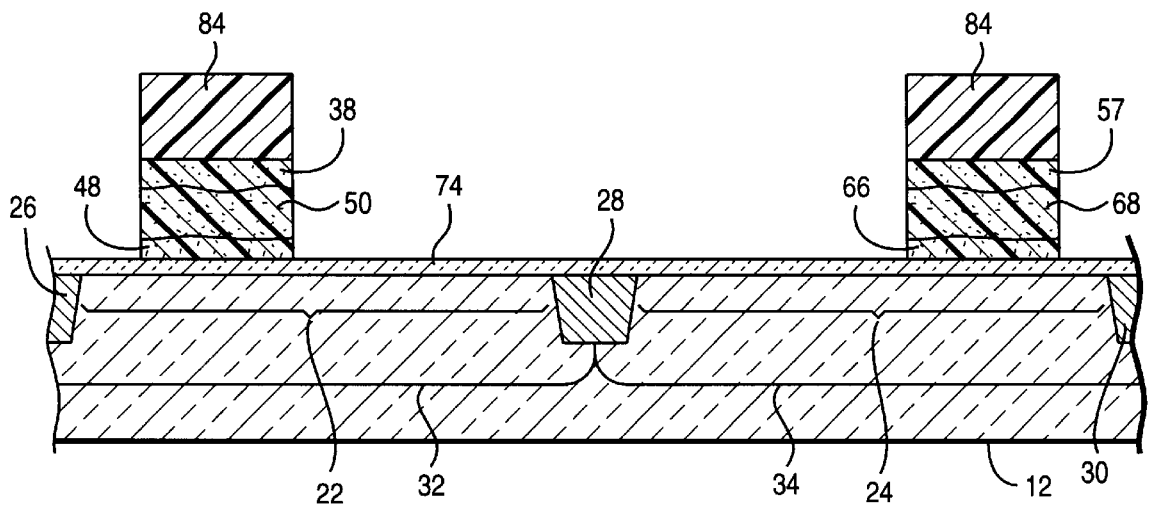
FIG. 8 is a cross-sectional view like FIG. 7 depicting patterning of the conductor layer of FIG. 7 into respective gate electrodes in accordance with the present invention.

The patterning of the conductor layer 76 to define the gate electrodes 38 and 57 may be understood by referring now to FIGS. 7 and 8. A photoresist 84 is applied to the conductor layer 76 shown in FIG. 7 and patterned. The layer 76 is next anisotropically etched to yield the defined gate electrodes 38 and 57 as shown in FIG. 8. The etch to establish the gate electrodes 38 and 57 may be performed selectively to the gate dielectric layer 74 as shown so that the layer 74 may be left in place as a screen oxide against subsequent implants or, alternatively, the etch may be to the substrate 12. Reactive ion etching ("RIE"), chemical plasma etching or the like may be used in conjunction with a variety of etchant species suitable for anisotropically etching polysilicon, such as, for example, $CF_4/O_2$. The widths of the gate electrodes 38 and 57 will typically be the minimum feature size available with the prevailing lithographic patterning system, although larger geometries are possible. The definition of the gate electrodes 38 and 57 from the conductor layer 76 depicted in FIG. 7 segregates the nitrogen doped regions 78 depicted in FIG. 7 into the respective nitrogen doped regions 48 and 66 and the germanium region 80 into the germanium regions 50 and 68 as shown in FIG. 8.

Figure 9:
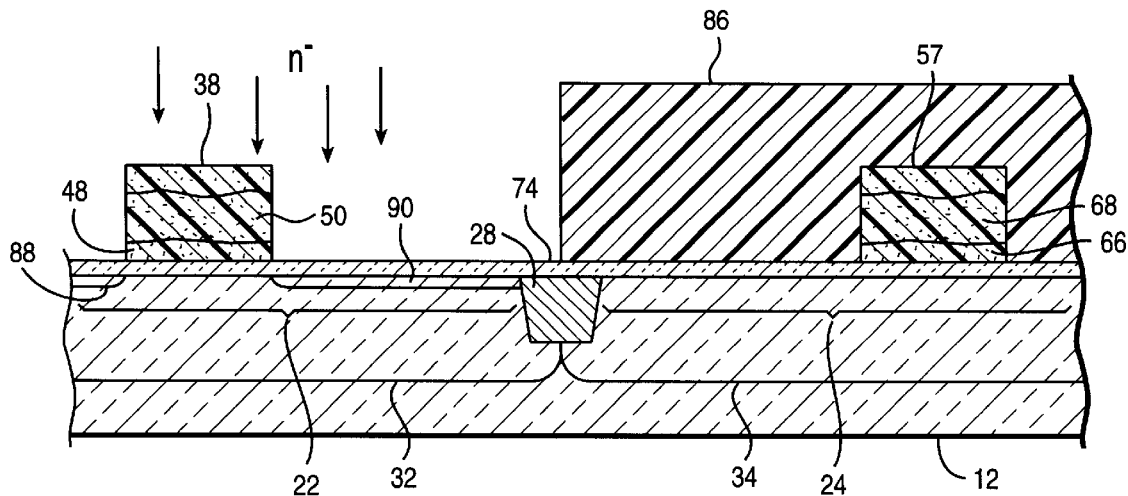
FIG. 9 is a cross-sectional view like FIG. 8 depicting fabrication of LDD structures for a transistor in accordance with the present invention.
Figure 10:
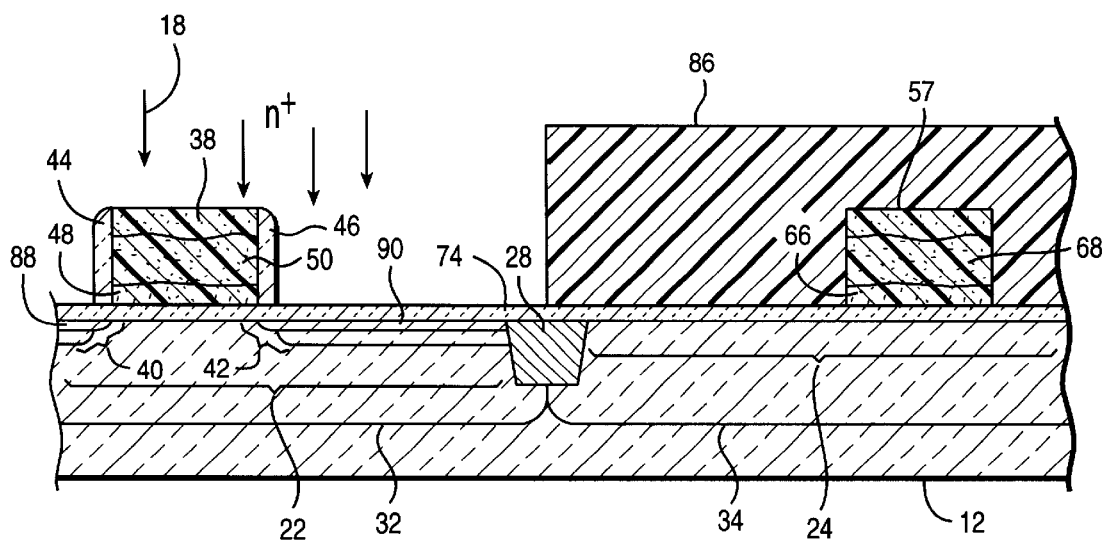
FIG. 10 is a cross-sectional view like FIG. 9 depicting further fabrication of source/drain regions and sidewall spacers for a transistor in accordance with the present invention.

The fabrication of the source/drain regions 40 and 42 for the transistor 18 may be understood by referring now to FIGS. 9 and 10. The source/drain regions 40 and 42 as shown in FIG. 2 may be established by ion implantation or diffusion, and may be single or multi-graded as desired. In the illustrated embodiment, the source/drain regions 40 and 42 are multi-graded and established by ion implantation. Initially, the active area 24 is masked with photoresist 86 and an implant is performed to establish lightly doped drain structures LDD 88 and 90 self aligned to the gate electrode 38. A variety of n-type impurity species may be used, such as, for example, arsenic, phosphorus or the like. In an exemplary embodiment, arsenic may be implanted with an energy of about 2 to 20 keV and a dosage of about 5E14 to 3E15 $cm^{-2}$. The implant may be on or off axis as desired. The relatively low implant energy combined with the screening effect of the insulating layer 74 establishes initially shallow junctions for the LDD structures 88 and 90.

Next, and as shown in FIG. 10, the sidewall spacers 44 and 46 are fabricated in anticipation of an additional source/drain implant. Initially, the exposed portions of the insulating layer 74 are anisotropically etched selectively to the substrate 12 by RIE, chemical plasma etching or the like using a species such as $CF_4/H_2$. The spacers 44 and 46 are fabricated by oxidation or blanket deposition of a variety of suitable dielectric sidewall spacer materials, such as, for example, silicon nitride, silicon dioxide, silicon oxynitride or the like. In an exemplary embodiment, the spacers 44 and 46 are composed of silicon nitride and may be fabricated by blanket deposition using low pressure or plasma enhanced CVD to a thickness of about 20 to 100 Å followed by an anisotropic etch selective to the substrate 12 to yield the completed spacers 44 and 46. Again, the etch may be by RIE, chemical plasma etching, or other suitable anisotropic etching techniques utilizing a chemistry suitable for anisotropically etching silicon nitride, such as $C_3F_8$.

A second implant is performed to complete the source/drain regions 40 and 42 using an n-type dopant specie of the type described above. In an exemplary embodiment, arsenic is implanted with a dosage of about 1E15 to 1E16 $cm^{-2}$ and an energy of about 10 to 30 keV. The implant may again be on or off axis.

The photoresist 86 may be stripped by ashing and an identical photoresist mask (not shown) may be applied to the active area 22 and the source/drain regions 58 and 60 fabricated for the transistor 20 using like implant and spacer formation techniques, albeit, with an impurity species of opposite conductivity type, such as boron, $BF_2$ or the like. The LDD and heavier dosage implants may be performed using the dosages set forth above for the n-type implants. The energies for the implants may be atomic mass-proportional to the energies specified for the n-type implants.

Referring again to FIG. 2, the silicide layer 47 may be composed of the reaction product of silicon and a variety of metals, such as cobalt, titanium, platinum, palladium, nickel, tungsten, tantalum, molybdenum, or the like. The metal may be applied by CVD, sputter, jet vapor or like techniques. In an exemplary embodiment, the layer 47 is composed of CoSi. Cobalt is deposited by sputter to a thickness of about 200 to 500 Å. The substrate 12 is subjected to a heating cycle to initiate a silicide forming reaction. The time and temperature required for the silicide reaction will depend upon the desired amount of silicide formed and the desired reaction rate. In an exemplary embodiment the substrate 12 may be heated to about 600 to 800° C. for about 10 to 30 minutes. Following the initial anneal, a second anneal may be performed at about 600 to 700° C. for about 15 seconds to stabilize the silicide.

The high temperature steps associated with the silicide forming reaction may be relied upon to anneal and activate the source/drain regions 40, 42, 58 and 60. Alternatively, a separate anneal may be performed by heating the substrate 12 at about 800 to 1000° C. for about 10 to 30 seconds in an RTA process or for about 10 to 30 minutes in a furnace process as desired.

An alternate exemplary process flow in accordance with the present invention may be understood by referring again to FIG. 4. A quantity of germanium may be introduced into the polysilicon conductor layer 76 by in situ vapor phase deposition in lieu of a subsequent ion implantation step as described above and depicted in FIG. 6. For example, polysilicon may be deposited by low pressure CVD with vapor phase germanium mixed therewith at a concentration of approximately 5 to 40 wt. % germanium. The conductor layer 76 may then be processed as generally described above, with or without the germanium implantation step. The high temperature anneal of the conductor layer 76 will concentrate the germanium in the lower portions of the conductor layer 76, leaving the upper portion thereof relatively free of germanium to facilitate the subsequent metal-silicon silicide reaction.

The process in accordance with the present invention provides for the simultaneous doping of the gate electrodes of two different device types, namely an n-channel device and p-channel device, using a single series of implants. Uniform conductivity doping of both n⁺ and p⁺ gates is provided through the use of a blanket implant of a single conductivity-type impurity species. The risk of gate-to-substrate dopant migration is reduced by the incorporation of the nitrogen regions 52 and 70 (See FIG. 2). The formation of the germanium regions 50 and 68 establishes work functions suitable for both p-channel and n-channel devices. In this way, better symmetry of threshold voltages for the n-channel and p-channel transistors transistor 18 and 20 may be obtained, enabling the p-channel transistor 20 to function more as a surface control transistor than a conventional p-channel transistor.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An integrated circuit, comprising:

a substrate; and a plurality of transistors positioned on the substrate, each of the plurality of transistors having a gate dielectric layer positioned on the substrate, a first source/drain region and a second source/drain region, and a gate electrode positioned on the gate dielectric layer, the gate electrode having a lower surface, a midpoint, a quantity of p-type impurity, a quantity of nitrogen having a peak concentration proximate the lower surface, and a quantity of germanium, wherein the peak concentration of germanium is positioned approximately between the midpoint and the lower surface.

2. The integrated circuit of claim 1, wherein each of the first and second source/drain regions comprises a lightly doped drain and a heavier doped region.

3. The integrated circuit of claim 1, wherein the gate electrode is composed of polysilicon.

4. The integrated circuit of claim 1, wherein the p-type impurity comprises $BF_2$.

5. The integrated circuit of claim 1, comprising a silicide layer positioned on the gate electrode and the first and second source/drain regions.

6. An integrated circuit transistor on a substrate, comprising:

a gate dielectric layer positioned on the substrate;

a first source/drain region and a second source/drain region; and a gate electrode positioned on the gate dielectric layer, the gate electrode having a lower surface, a midpoint, a quantity of p-type impurity, a quantity of nitrogen having a peak concentration proximate the lower surface, and a quantity of germanium, wherein the peak concentration of germanium is positioned approximately between the midpoint and the lower surface.

7. The integrated circuit transistor of claim 6, wherein each of the first and second source/drain regions comprises a lightly doped drain and a heavier doped region.

8. The integrated circuit transistor of claim 6, wherein the gate electrode is composed of polysilicon.

9. The integrated circuit transistor of claim 6, wherein the p-type impurity comprises $BF_2$.

10. The integrated circuit transistor of claim 6, comprising a silicide layer positioned on the gate electrode and the first and second source/drain regions.

* * * * *